(12) United States Patent
Sakurai

(10) Patent No.: US 7,202,597 B2
(45) Date of Patent: Apr. 10, 2007

(54) PIXEL ELEMENT SUBSTRATE, DISPLAY DEVICE, ELECTRONIC DEVICE, AND METHOD FOR MANUFACTURING THE PIXEL ELEMENT SUBSTRATE

(75) Inventor: Kazunori Sakurai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 28 days.

(21) Appl. No.: 10/888,015

(22) Filed: Jul. 12, 2004

(65) Prior Publication Data
US 2005/0040754 A1 Feb. 24, 2005

(30) Foreign Application Priority Data
Aug. 22, 2003 (JP) ............... 2003-298611

(51) Int. Cl.
*H01J 1/62* (2006.01)
*H01J 63/04* (2006.01)
*H01J 9/00* (2006.01)

(52) U.S. Cl. .......... 313/500; 313/505; 313/506; 313/512; 445/24

(58) Field of Classification Search ........... 313/500
See application file for complete search history.

(56) References Cited

U.S. PATENT DOCUMENTS

| | | | |
|---|---|---|---|
| 6,798,132 B2 * | 9/2004 | Satake | 313/495 |
| 6,919,680 B2 * | 7/2005 | Shimoda et al. | 313/498 |
| 7,132,796 B2 * | 11/2006 | Lee et al. | 313/504 |
| 2003/0127652 A1 * | 7/2003 | Park et al. | 313/500 |
| 2003/0136966 A1 * | 7/2003 | Inoue et al. | 257/79 |

FOREIGN PATENT DOCUMENTS

| | | |
|---|---|---|
| JP | A-05-167004 | 7/1993 |
| JP | A 11-045868 | 2/1999 |
| JP | A-2001-094041 | 4/2001 |
| JP | A 2001-102168 | 4/2001 |
| JP | A 2003-17245 | 1/2003 |
| JP | A 2003-280552 | 10/2003 |
| JP | A 2004-327215 | 11/2004 |

OTHER PUBLICATIONS

U.S. Appl. No. 10/765,197, filed Jan. 28, 2004, Kimura.

* cited by examiner

Primary Examiner—Sikha Roy
Assistant Examiner—Natalie K. Walford
(74) Attorney, Agent, or Firm—Oliff & Berridge, PLC

(57) ABSTRACT

To provide a display device that applies a uniform driving voltage to each pixel and prevents light emitting regions from being narrower. In a display device obtained by bonding a pixel element substrate to a driving circuit board having a driving circuit for the plurality of pixel elements, the driving circuit board includes connecting terminals connected to the driving circuit for the plurality of pixel elements on the surface of the driving circuit board facing the pixel element substrate. The pixel element substrate comprises pixel electrodes 112 formed on a transmissive substrate 110, pixel elements 120 formed on the plurality of pixel electrodes such that respective ends of the pixel elements are adjacent to each other, common electrode wiring lines 131 for commonly connecting the other respective ends of the plurality of pixel elements to each other, bank regions 115 for separating the pixel elements from each other to define individual pixel element regions, and individual electrode wiring lines 132 for connecting the connecting terminals of the driving circuit board to the corresponding pixel electrodes of the pixel elements via throughholes formed in the bank regions.

9 Claims, 10 Drawing Sheets

LIGHT EMISSION

SECTION A-A

SECTION A-A

SECTION A-A

SECTION A-A

SECTION B-B

SECTION A-A

SECTION A-A

FIG.8
FIG.8A
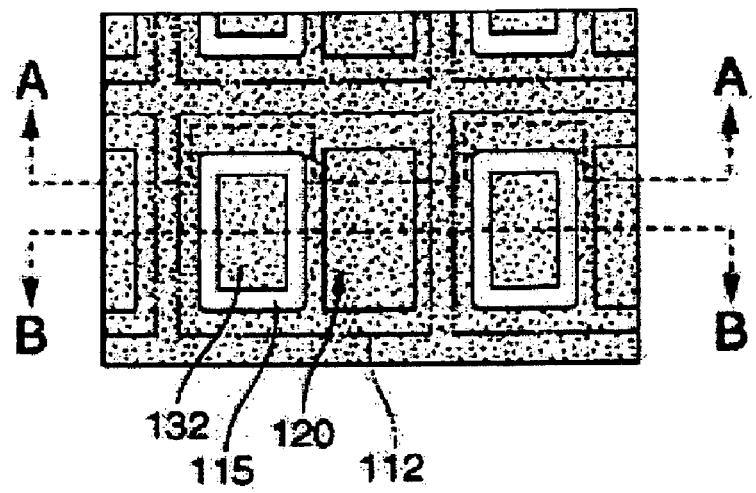
FIG.8B
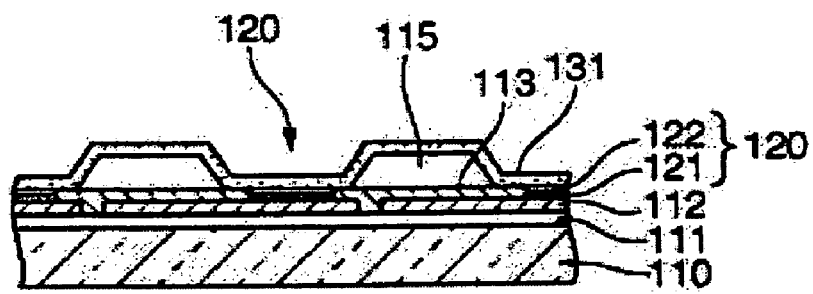
SECTION A-A
FIG.8C
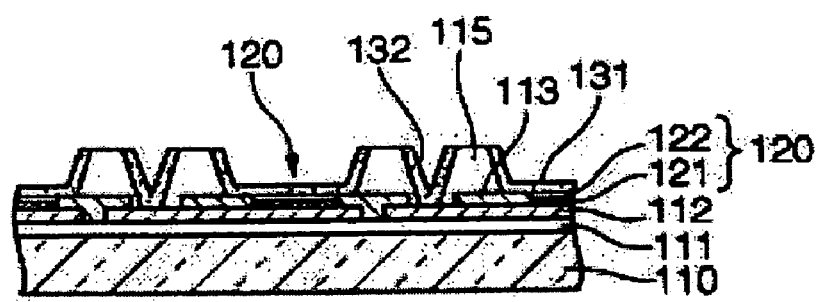
SECTION B-B

LIGHT EMISSION

LIGHT EMISSION    LIGHT EMISSION

PIXEL ELEMENT SUBSTRATE, DISPLAY DEVICE, ELECTRONIC DEVICE, AND METHOD FOR MANUFACTURING THE PIXEL ELEMENT SUBSTRATE

BACKGROUND OF THE INVENTION

1. Field of Invention

The present invention relates to a display device and a manufacturing method thereof using an electroluminescent (EL) element or a liquid crystal display element, and more specifically, it relates to a display device and a method for manufacturing the same that improves the aperture efficiency of pixels.

2. Description of Related Art

The applicant filed a patent application for "An organic EL display device and a manufacturing method thereof" on Dec. 18, 2002. The patent application proposes manufacturing a display device in which an EL substrate having an organic EL element incorporated therein is bonded to a driving circuit board having a driving circuit for driving the organic EL element incorporated therein. Accordingly, for example, it allows a display device to be efficiently produced.

In the proposed display device, an EL substrate having a plurality of organic EL elements arranged therein is bonded to a plurality of driving circuit boards for driving the organic EL elements as in reference examples (see FIGS. 10 and 11) to be described below. Thus, transparent common electrode wiring lines (made of indium tin oxide (ITO)) are formed on the EL substrate for commonly connecting the transparent common electrode wiring lines to the plurality of organic EL elements to each other. Pixel electrodes (made of Al) are arranged for every organic EL element on the surface of the EL substrate facing the driving circuit board. Thus allows the driving circuits of the driving circuit board to be easily connected to the organic EL elements.

[Patent reference 1] Japanese Patent Application No. 2001-385179

SUMMARY OF THE INVENTION

However, in order to output light emitted from the organic EL elements through the EL substrate to the outside, a transparent electrode is formed as a common electrode. ITO used for a transparent electrode has a large resistance value. When it has a large screen (large area), it becomes difficult to apply uniform voltage to the organic EL elements constituting the screen due to the voltage drop. When it is impossible to apply uniform driving voltage to the organic EL elements, non-uniform light emission occurs, which significantly affects the image quality.

In order to solve the problems, it is considered that auxiliary wiring of a low resistance value such as aluminum is arranged at a bank portion in a grid-like form. However, when the width of the auxiliary wiring is widened to lower the resistance value, a light emitting region becomes smaller and the aperture efficiency is reduced. Accordingly, it becomes difficult that a common electrode is set to a sufficiently low resistance value.

Accordingly, an object of the present invention is to provide a display device that applies a uniform driving voltage to each pixel and prevents light emitting regions from being narrower.

Another object of the present invention is to provide an electronic apparatus having the improved display device mentioned above.

A further object of the present invention is to provide a pixel element substrate of a display device that applies a uniform driving voltage to each pixel and prevent light emitting regions from being narrower and a manufacturing method thereof.

In order to accomplish the above objects, a display device of the present invention is obtained by bonding a pixel element substrate having a plurality of pixel elements arranged thereon to a driving circuit board having a driving circuit for the plurality of pixel elements. The driving circuit board includes connecting terminals connected to the driving circuit for the plurality of pixel elements on the surface of the driving circuit board facing the pixel element substrate. The pixel element substrate comprises a plurality of pixel electrodes formed on a transmissive substrate, the plurality of pixel elements being formed on the plurality of pixel electrodes such that respective ends of the pixel elements are adjacent to each other, common electrode wiring lines for commonly connecting the other respective ends of the plurality of pixel elements to each other, bank regions for separating the pixel elements from each other to define individual pixel element regions, and a plurality of individual electrode wiring lines for connecting the plurality of connecting terminals of the driving circuit board to the corresponding pixel electrodes of the plurality of pixel elements via through-holes formed in the bank regions.

According to the above-described construction, an individual electrode of each pixel is arranged on the transmissive substrate side of a pixel element substrate. A configuration that has a common electrode on the side of the pixel element substrate facing a driving circuit can be obtained. Since the individual electrode has a small area, a material having a relatively large resistance value, for example, ITO (Indium Tin Oxide) can be used. Since the region of auxiliary wiring for lowering a resistance value is not required, an individual electrode having a great area can be obtained, and the ratio of a light emitting region in a region allotted to one pixel can be increased.

Further, each of the bank regions has a plurality of stepped portions. The through-holes are formed at the highest portions of the stepped portions. Films of the pixel elements are formed using other stepped portions. Accordingly, the individual electrode wiring lines and the driving circuit board are easily connected to each other. Also, the pixel elements are formed using other stepped portions. For example, the organic EL element is easily formed using a liquid drop discharge method (ink jet method).

Also, each of the pixel elements comprises an organic electroluminescent element, a liquid crystal display device, or a light emitting diode. This allows a display device to be easily formed.

Furthermore, each of the pixel electrodes is a transparent electrode, and the light emitted from or transmitted through the pixel elements is directed to the pixel element substrate. An individual electrode defined to have a small area on the transmissive substrate side of each pixel element is formed of a transparent electrode. A high conductive metal including Al, Cu, and Cr is used as the common electrode on the side of the pixel element substrate facing a driving circuit. Accordingly, although ITO (transparent electrode) having a relatively low resistance value and a high transparency is used, the problem such as a voltage drop can be solved.

Also, a glass substrate or a flexible plastic substrate can be used as the above-described pixel element substrate, a driving circuit board.

When the above-described display device is used in an electronic device such as a mobile computer, a portable telephone, a digital camera, a PDA, a portable TV, the present invention has an advantage that a compact display section can be formed.

Also, a pixel element substrate of the present invention comprises a plurality of pixel electrodes formed on a transmissive substrate, a plurality of pixel elements formed on the plurality of pixel electrodes such that respective ends of the pixel elements are adjacent to each other, common electrode wiring lines for commonly connecting the other respective ends of the plurality of pixel elements to each other, bank regions for separating the pixel elements from each other to define individual pixel element regions; and a plurality of individual electrode wiring lines for connecting a plurality of external connections formed to correspond to the plurality of pixel electrodes on surfaces of the bank regions to the plurality of pixel electrodes via through-holes formed in the bank regions.

Also, according to the above-described construction, the present invention can obtain a configuration that has a picture electrode of a small area determined on the transmissive substrate side as a picture, and has a common electrode at an opposite side thereof. Since each pixel electrode has a small area, the influence such as voltage drop can be reduced, though a pixel element material having a high resistance value, for example, ITO is used for a transparent electrode.

Also, a method for manufacturing a pixel element substrate according to the present invention comprising: a first step of forming a conductive layer capable of transmitting light on a transmissive insulating substrate and patterning the conductive layer to form a plurality of pixel electrodes; a second step of forming an insulating layer on the plurality of pixel electrodes, and patterning the insulating layer to form a contact hole region and a pixel element forming region on each pixel electrode; a third step of forming each contact hole region and each pixel element forming region on the insulating layer, forming a bank layer having a first height of a relatively higher value at the periphery of each contact hole region and having a second height of a relatively lower value at the periphery of each pixel element forming region; a fourth step of forming a pixel element on a pixel electrode of each pixel element forming region; and a fifth step of forming a conductive layer on the contact hole, the bank layer, and each pixel element, and polishing the conductive layer until a portion of the bank layer having the first height is exposed.

Preferably, the third step further comprises the steps of: forming on the insulating layer a first bank layer having the second height, which forms each contact hole region and each pixel element forming region, and forming a second bank layer having the first height at the periphery of each contact hole region in the first bank layer. As a result, stepped portions can be formed in each bank layer.

Preferably, the pixel element is an organic electroluminescent element.

According to the present invention, since pixel electrodes having a small area are arranged on the transparent (transmissive) substrate side, a high conductive metal having Al, Cu, or Cr is used for a common electrode on the side of the pixel element substrate facing the driving circuit. Thus, even though an electrode material having a high resistance value, for example, ITO is used on the transparent (transmissive) substrate side, the nonuniformity of brightness of an image due to a voltage drop hardly occurs. Further, since auxiliary wiring of a mesh form is not required at the peripheries of pixels in order to reduce the resistance of an electronic material having a high resistance, the aperture efficiency of a display region can be improved.

BRIEF DESCRIPTION OF THE DRAWINGS

FIG. 8 illustrates a manufacturing process of the display device shown in FIG. 1.

DETAILED DESCRIPTION OF PREFERRED EMBODIMENTS

Hereinafter, embodiments of the present invention will be described with reference to the accompanying drawings.

An embodiment according to the present invention manufactures a display device by facing a pixel element substrate and a driving circuit board each other. The pixel element substrate is made of a pixel element. The driving circuit board is made of a driving circuit. The driving circuit drives the pixel element. In a pixel element substrate of the thin film device, a plurality of pixel elements having at least two electrodes is arranged and the pixel elements are insulated from each other by a bank. One electrode of the pixel element is a transparent pixel electrode that is determined as a picture at a translucent substrate side of a pixel element substrate. Another electrode is a common electrode that commonly connects a plurality of pixel elements arranged at a side surface facing a driving circuit board with each other. A picture is visibly recognized by light passing through a transmissive substrate of a pixel element substrate. A light-emitting region is surrounded by a bank. Through-hole region is formed in the bank. The light emitting region and the through-hole region are allotted to one pixel. Wiring with respective pixel electrodes (transparent electrode) is derived to a side surface facing a driving circuit board of a pixel element substrate using a through-hole.

[Embodiment 1]

Figure 1:
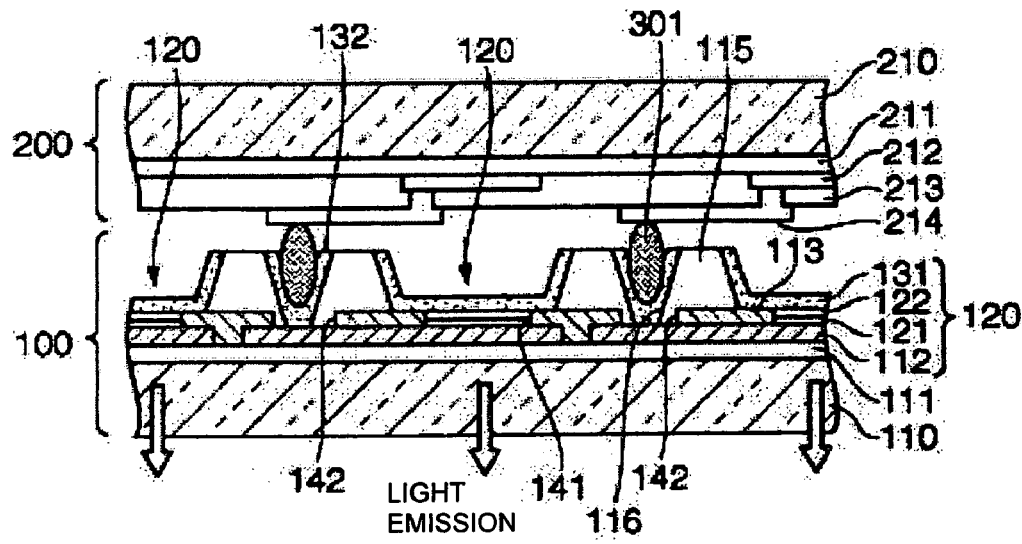
FIG. 1 is a sectional view illustrating a display device according to an embodiment of the present invention.

FIG. 1 shows a display device according to an embodiment of the present invention. The display device is roughly classified into a pixel element substrate 100 and a driving circuit substrate 200.

First, the pixel element substrate 100 includes a substrate 110, an insulating layer 111, a transparent pixel electrode 112, an insulating layer 113, a bank layer 115, a through-hole 116, an organic EL element 120 as a pixel element, and a common electrode layer 131.

The substrate 110 is a transparent substrate that is made of non-alkaline glass, such as quartz glass, or plastic film. As described below, the insulating layer 111 is formed on the substrate 110. A plurality of the pixel electrodes 112 is patterned in a quadrangular form and arranged on the insulating layer 111. The pixel electrodes 112 are made of transparent ITO. The periphery and the upper surface of the pixel electrode 112 are coated with an insulating layer 113, and are isolated (insulated) from another pixel electrode 112. The insulating layer 113 on the pixel electrode 112 opens a pixel forming region 141 and a through-hole forming region 142.

The bank layer 115 is formed on the insulating layer 113 like a dam that surrounds the periphery of the pixel forming region 141 and the through-hole forming region 142. The bank layer 115 includes a plurality of stepped portions (see FIG. 5) to be described later in detail. The peripheral portion of the through-hole forming region 142 comes to its maximum height. In other words, an upper center portion of a highest step in the bank layer 115 becomes a through-hole 116. A part of the pixel electrode 112 is exposed at the bottom of the through-hole 116. A pixel electrode wiring line 132 is formed by burying the through-hole 116 with a conductive material such as aluminum. The pixel electrode wiring line 132 is an individual electrode wiring line connected to the pixel electrode 112. The upper end of the pixel electrode wiring line 132 becomes a connector with a driving circuit.

Furthermore, a stepped portion is formed in a region that surrounds the pixel forming region 141 to expose a main part of pixel electrode 112 of the bank layer 115. The stepped portion can be used to form the pixel electrode 120. The bank layer 115 is formed of an insulating material such as an acrylic resin, polyimide, and silicon oxide.

The pixel element 120 is formed in a pixel forming region 141, and defines a unit pixel of a display screen (or display region). In the embodiment of the present invention, an organic EL element is formed as the pixel element 120. An organic EL element is constructed by forming a hole injecting layer 121, an organic EL layer 122, and a cathode 131 on the transparent pixel electrode 112. The organic EL element is made of a known material and is formed by a known manufacturing method employed in the art. The cathode 131 is formed of calcium or aluminum, and is connected to common electrode wiring lines 131 that commonly connect respective organic EL elements to each other.

In the pixel element substrate 100 having the above-described construction, the lower surface of the substrate 100 functions as a display surface. The plurality of pixel elements 120 is arranged on the upper surface of the substrate 10. Each pixel element uses the transparent pixel electrode 112 as one end and a common electrode 131 as another end. The transparent pixel electrode 112 is divided into pieces for every pixel element that is formed on the upper surface of the substrate 10. Thus, a region insulated from the common electrode 131 is formed using the bank layer 115. A terminal section of connecting wiring in each pixel electrode is formed in each region.

On the other hand, the driving circuit board 200 is obtained by forming an insulating film 211 on the surface of a substrate 210. The insulating film 211 is made of silicon oxide and the like. The substrate 210 is made of an insulating material such as non-alkaline glass or a plastic film. Moreover, a plurality of driving circuits 212 are formed corresponding to the arrangement of the respective pixel elements 120 on the insulating film 211. Specifically, the pixel element 120 is the above-described organic EL element. Each driving circuit 212 includes a capacitor, a scanning line, and a signal line other than a thin film transistor (TFT). The driving circuits 212 are insulated from each other by an insulating layer 213 made of silicon oxide. A plurality of connecting terminals 214 is formed on the insulating layer 213 and is connected to the respective driving circuits 212 via through-holes. Each of the connecting terminals 214 is arranged at a position corresponding to the terminal section of the connecting wiring 132 of each pixel electrode 112 in the pixel element substrate 100 and on the surface of the driving circuit board 200 facing the pixel element substrate 100.

By bonding the pixel element substrate 100 to the driving circuit board 200 having the above-described construction with a conductive resin 301 therebetween, a display device is formed. The conductive resin 301, such as silver paste or copper paste, can be obtained by mixing a resin with metal. An anisotropic conductive resin or an anisotropic conductive film may be used as the conductive resin 301.

In accordance with such a configuration, the common electrode is formed of a metallic thin film. Accordingly, although the transparent pixel electrode is formed of ITO having a high resistance value, the area of the transparent pixel electrode is small. Thus, a problem, such as voltage drop, does not occur. Also, since the driving circuit is connected to the pixel electrode via through-hole using a bank portion that separates pixels from each other, the aperture efficiency thereof is higher than that of a reference example to be described later.

The above-described construction is also applicable to a liquid crystal display device or a light emitting diode in which a pixel element is formed between two electrodes.

Then, in order easily to help understanding about the above-described characteristics of the embodiment of the present invention, a patent application as a reference example filed prior to the present application will be described with reference to FIGS. 10 and 11.

Figure 10:
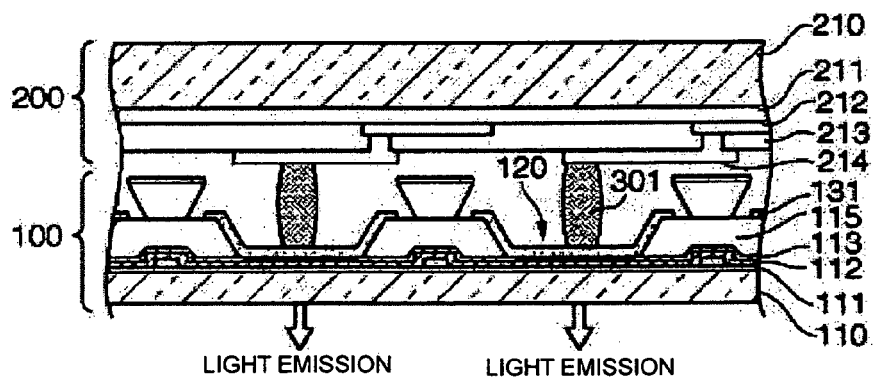
FIG. 10 illustrates a reference example of the display device.
Figure 11:
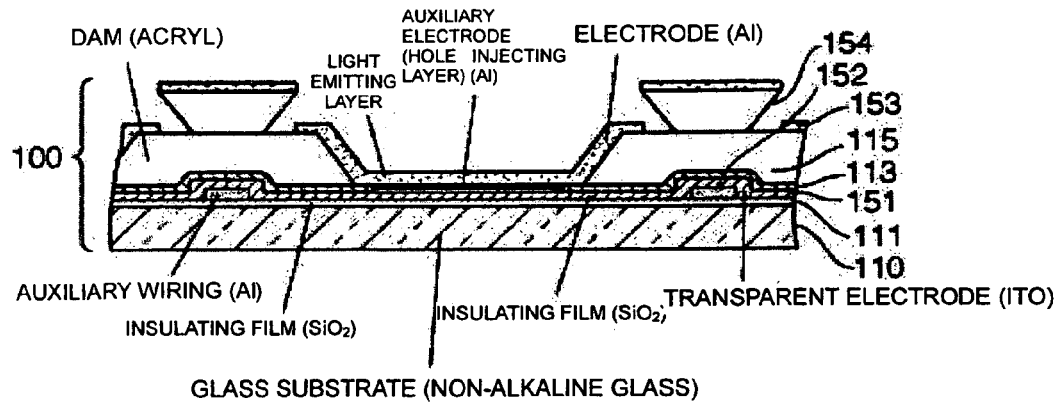
FIG. 11 illustrates a reference example of the display device.

FIG. 10 is a sectional view showing a display device of a reference example. FIG. 11 is a view showing a pixel element substrate of a display device. The components in FIGS. 10 and 11 corresponding to those in FIG. 1 are given the same reference numerals, so the description thereof will be omitted.

In the reference example, a transparent electrode (ITO) is formed as a common electrode 151 of each pixel element 120 on a glass substrate 110 with an insulating film 111 therebetween. As described above, since ITO has a high resistance value, it restrains voltage drop in the common electrode 151 having a large area. Accordingly, auxiliary wiring 152 of aluminum is formed at a bank portion separating respective pixels from each other in a lattice form (mesh form). The anode of the pixel element 120 contacts the common electrode 151. The cathode of the pixel element 120 contacts a pixel electrode 153 of aluminum, which is separated into pieces. The pixel electrodes 153 are separated from each other by a cathode separator 154.

The pixel element substrate 100 having the above-described construction is bonded to the driving circuit board 100 with a conductive resin 301 therebetween to form a display device.

In the above-described construction of the reference example, since it is required to arrange a wide auxiliary wiring 152 at the bank region in a mesh form in order to restrain voltage drop in the common electrode 151 having a high resistance value, the aperture efficiency is lowered.

[Embodiment 2]

Hereinafter, a process for manufacturing a pixel element substrate of a display device according to the present invention will be described with reference to FIGS. 2 to 9. Each (a) of FIGS. 2 to 8 is a plan view of the pixel element substrate. Each (b) of FIGS. 2 to 8 is a sectional view taken along the line A—A in FIGS. 2(a) to 8(a). Each (c) of FIGS. 5 to 8 is a sectional view taken along the line B—B in the plan view.

Figure 2A:
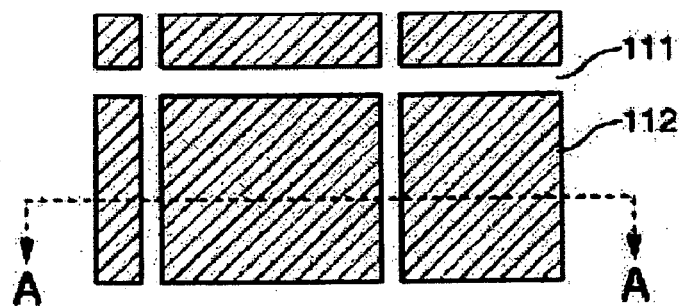
FIG. 2 illustrates a manufacturing process of the display device shown in FIG. 1.
Figure 2B:
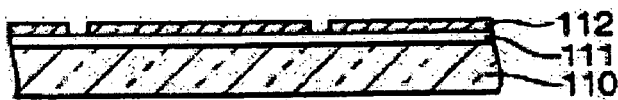

First, as shown in FIG. 2, on a non-alkaline glass substrate 110 having a thickness of 0.5 mm, for example, TEOS is dissolved in a film forming device by a plasma CVD method to form silicon oxide film of about 5000 Å, so that an insulating film 111 is formed. On the resulting object, an ITO film of about 500 Å is applied to form a transparent electrode layer. Then, using a mask (not shown) of a pixel electrode, a transparent electrode layer is patterned to form a plurality of pixel electrodes 112.

Figure 3A:
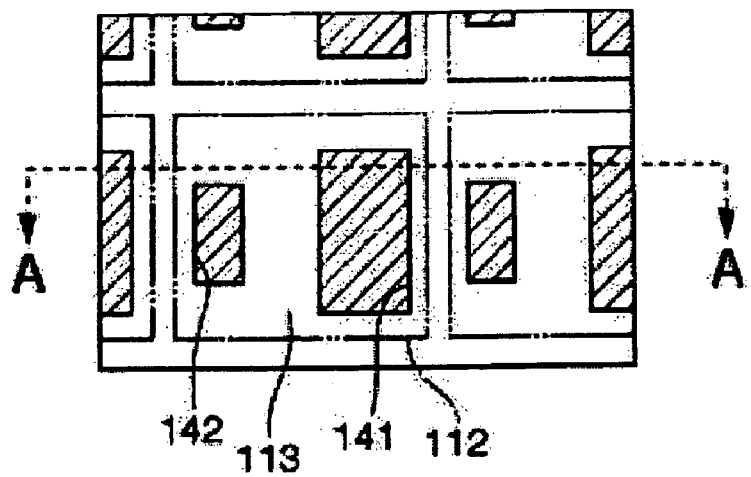
FIG. 3 illustrates a manufacturing process of the display device shown in FIG. 1.
Figure 3B:
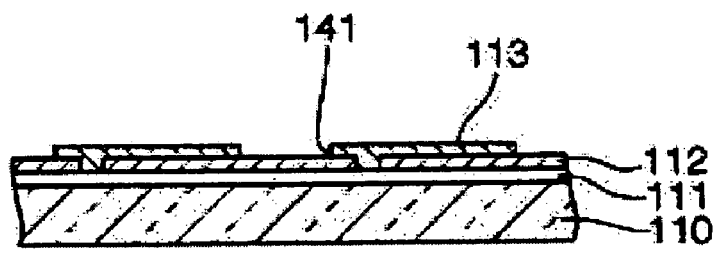

As shown FIG. 3, a silicon oxide layer of about 2000 Å is formed on the pixel electrodes 112 and the partially exposed insulating film 111 with a plasma CVD method, so that an insulating film 113 is formed. The insulating film 113 is patterned using a mask having through-hole regions and pixel element regions. Through-hole regions 116 and pixel element regions 141 are formed in the insulating film 113. Regions including the pixel electrodes 112 are indicated by two-dot chain lines in FIG. 3(a).

Figure 4A:
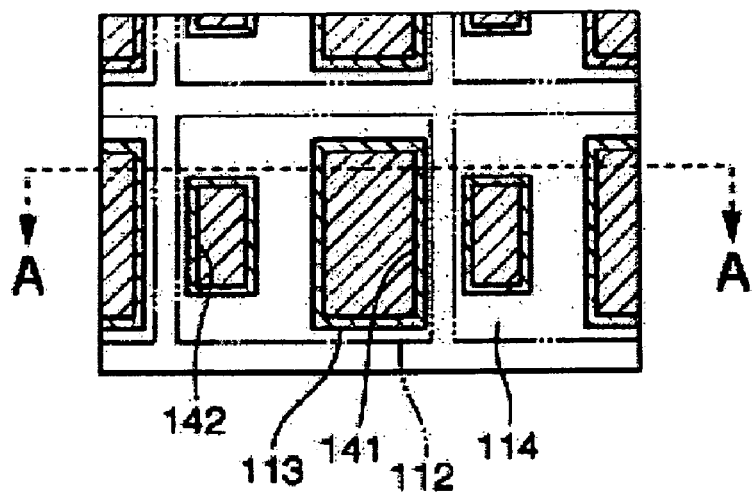
FIG. 4 illustrates a manufacturing process of the display device shown in FIG. 1.
Figure 4B:
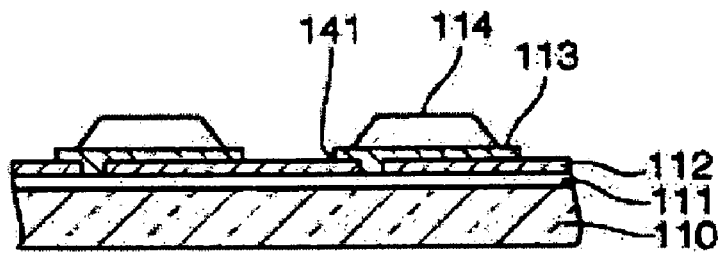

As shown in FIG. 4, using a printing method or liquid drop discharge method, a acrylic resin having a thickness of 2 μm is formed on the insulating film 113 rather than the through-hole regions 116 and the pixel element regions 141, so that a bank layer 114 is formed. The through-hole regions 116 and the pixel element regions 141 are not buried.

Figure 5A:
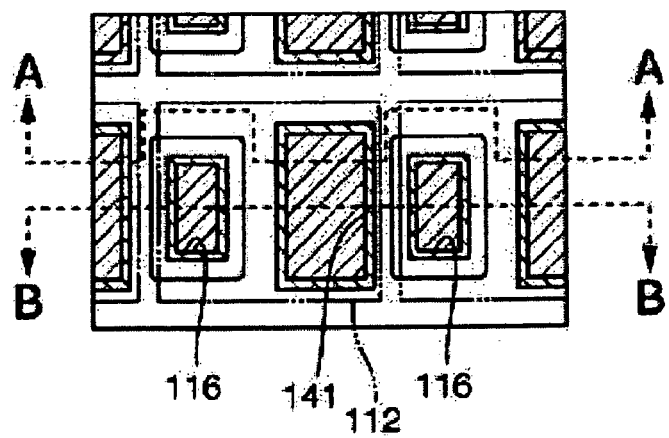
FIG. 5 illustrates a manufacturing process of the display device shown in FIG. 1.
Figure 5B:
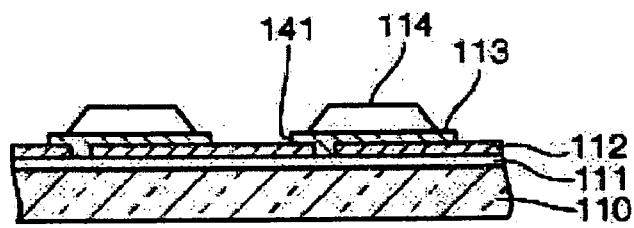
Figure 5C:
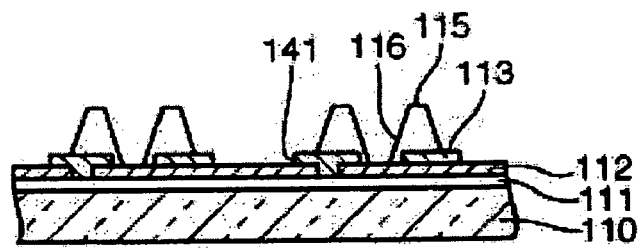

As shown in FIG. 5, using a printing method or liquid drop discharge method, an acrylic resin having a thickness of 2 μm is laminated at peripheries of the through-hole regions 116 and further on the bank layer 114 (see FIG. 5(b)), so that a bank layer 115 (see FIG. 5(c)) is formed. Accordingly, the bank layer is formed to have two stages of height of the bank layers 114 and 115. In the embodiment, the bank layer includes two stages. However, preferably, the bank layer can have more than three stages.

Figure 6A:
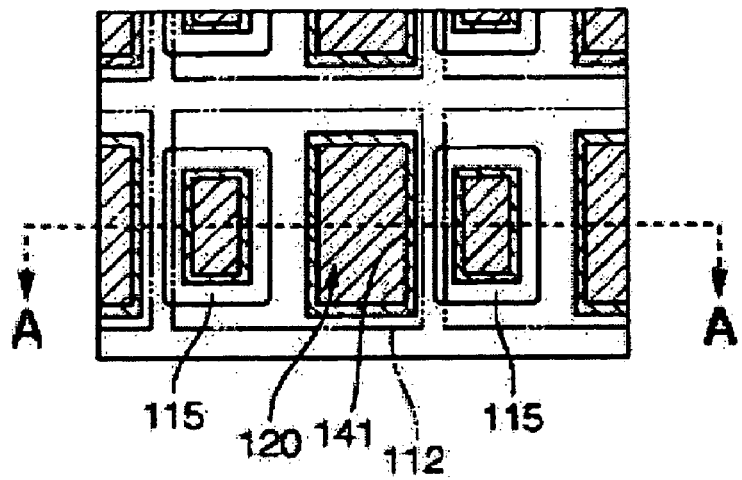
FIG. 6 illustrates a manufacturing process of the display device shown in FIG. 1.
Figure 6B:
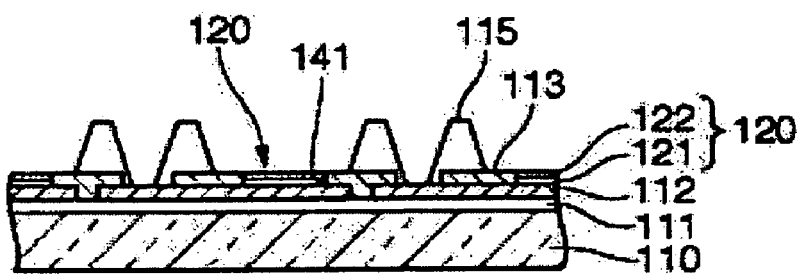

As shown in FIG. 6, by using a liquid drop discharge method, a hole injection layer having a thickness of about 1000 and an organic EL layer having a thickness of 1000 Å are formed on the pixel electrodes 112 of the pixel element regions 141.

Figure 7A:
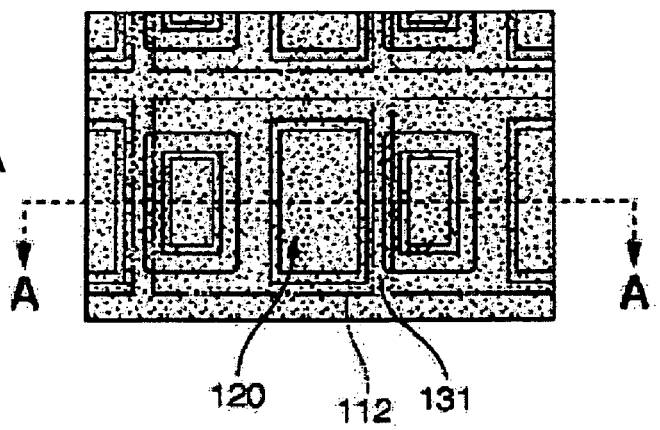
FIG. 7 illustrates a manufacturing process of the display device shown in FIG. 1.
Figure 7B:
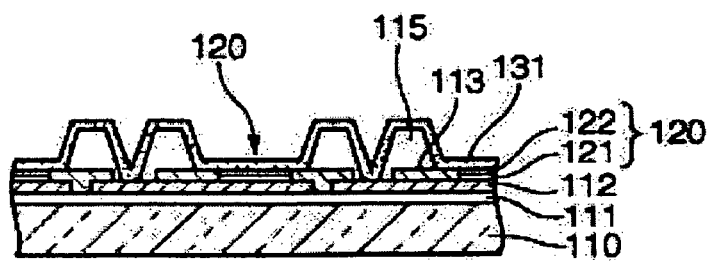

As shown in FIG. 7, aluminum (a conductive material) is deposited on the entire pixel element substrate 100 by a sputtering method, the through-hole regions 116 are buried, and the cathodes of organic EL elements and common electrode wiring lines 131 are formed. Accordingly, pixel elements 120 are formed.

As shown in FIG. 8, the entire pixel element substrate 100 is mechanically polished from the above. The aluminum layer 131 is shaved until the top surface of the bank layer 115 is exposed. Accordingly, in portions of the bank layer 115 around the through-holes, the common electrode wiring line 131 and the pixel electrode wiring line 132 are isolated (insulated) from each other. Furthermore, in the portions of the bank layer 115, the connected state between the electrodes (cathodes) 120 is maintained.

Figure 9:
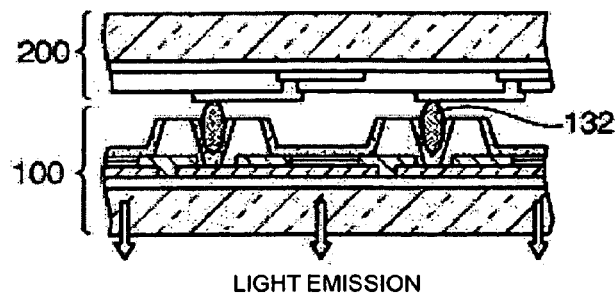
FIG. 9 illustrates a manufacturing process of the display device shown in FIG. 1.

As shown in FIG. 9, the pixel element substrate 100 and the driving circuit board 200 having the above-described construction are bonded to each other with a conductive resin interposed therebetween connecting terminal sections thereof. The pixel element substrate 100 and the driving circuit board 200 are bonded to each other with an adhesive.

In this way, a structure is obtained in which the wiring 132 of the pixel element electrodes 112 formed on the above-described pixel element substrate 100 is directed to the driving circuit board 200 side via the through-holes 116 formed in the bank layer 115.

As described above, according the manufacturing method of the embodiment, a display device having excellent aperture efficiency can be manufactured.

[Embodiment 3]

Hereinafter, several examples of an electronic apparatus including the above-described display device (organic EL display device) will be explained.

<First Example: Mobile Computer>

Figure 12:
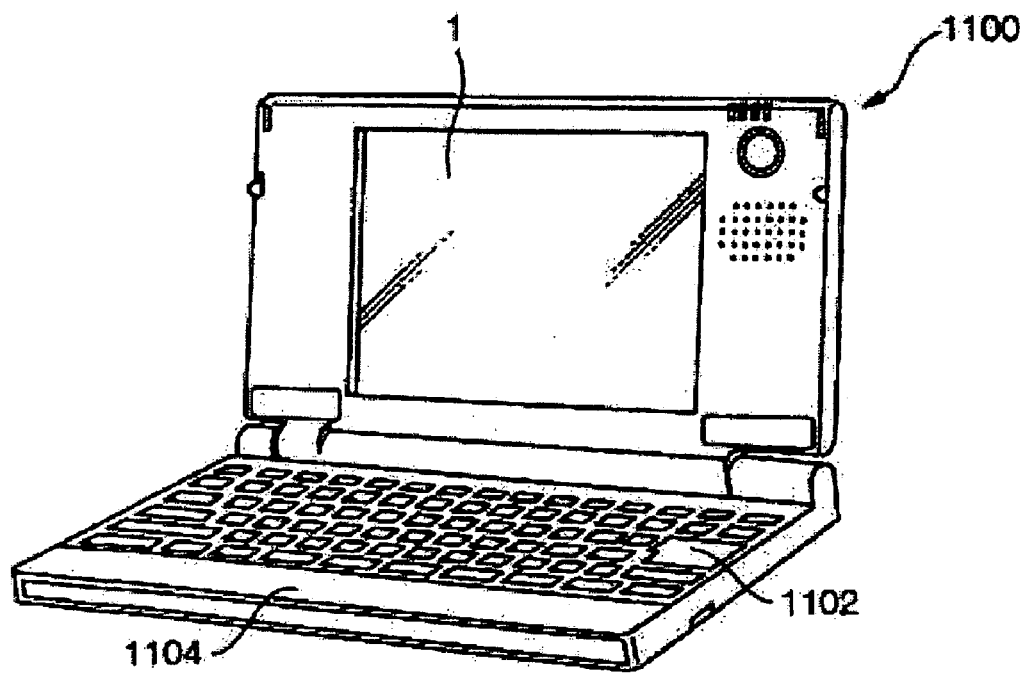
FIG. 12 illustrates an example of an electronic apparatus including a display device.

First, an example in which the organic EL display device 1 according to the embodiment is used for a mobile personal computer having will be described. FIG. 12 is a perspective view showing the configuration of the mobile personal computer. In FIG. 12, the personal computer 1100 includes a main body 1104 having a keyboard 1102, and an organic EL display device 1.

<Second Example: Portable Telephone>

Figure 13:
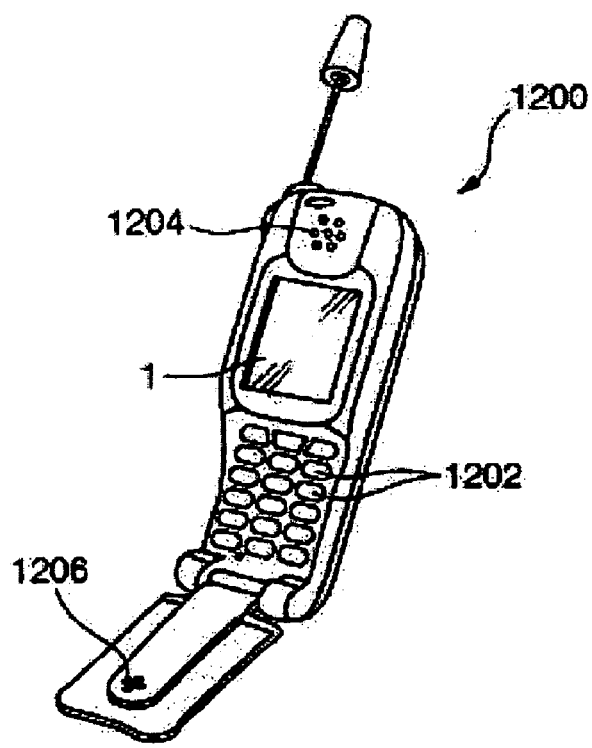
FIG. 13 illustrates an example of an electronic apparatus including a display device.

Next, an example in which the organic EL display panel is applied to a display unit of a portable telephone will be explained. FIG. 13 is a perspective view showing the configuration of the portable telephone. In FIG. 13, portable telephone 1200 includes a plurality of operating buttons 1202, an earpiece 1204, a mouthpiece 1206, and the above-described organic EL display device 1.

<Third Example: Digital Still Camera>

Figure 14:
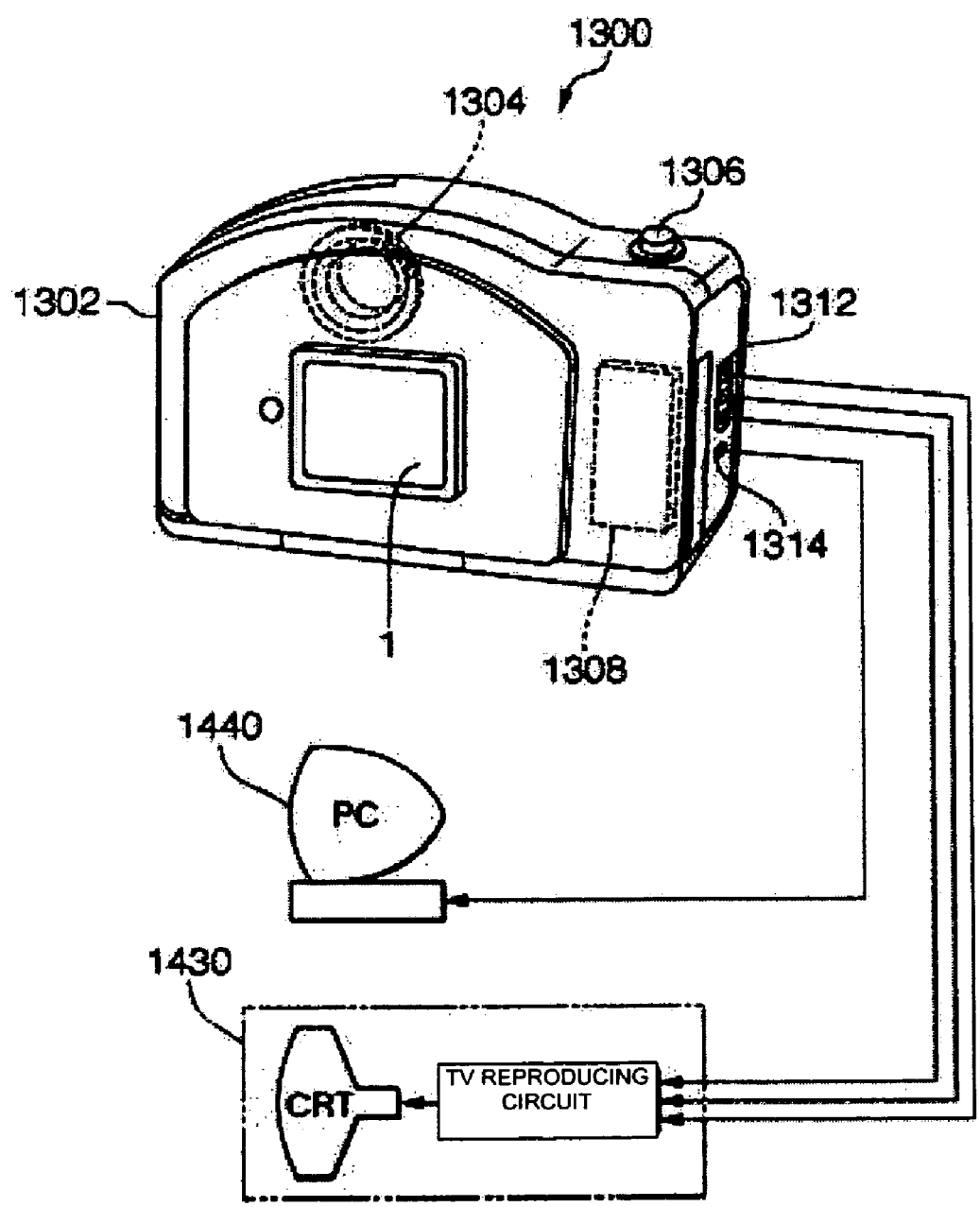
FIG. 14 illustrates an example of an electronic apparatus including a display device.

Further, the example of a digital still camera in which the organic EL display device 1 is used in a finder will be explained. FIG. 14 is a perspective view showing the configuration of the digital still camera and simply showing a connecting state thereof to external equipment.

A general camera exposes a film by a light image of a subject. On the contrary, a digital still camera 1300 photo-electrically converts the light phase of the subject by an image pick-up device, such as a charge coupled device (CCD), to generate an image pick-up signal. The above-described organic EL display device 1 is provided on the rear surface of a case 1302 in the digital still camera 1300. The display operation is performed based on the image pick-up signal generated by the CCD. Accordingly, the organic EL display device 1 functions as a finder that displays the subject. Also, on the observing side (the rear side in FIG. 14) of the case 1302, a light-receiving unit 1304 having an optical lens or a CCD is provided.

When a photographer recognizes an image of the subject displayed on the organic EL display device 1 and presses a shutter button 1306, the image pick-up signal of the CCD is transferred to a memory of a circuit board 1308 and stored therein. In the digital still camera 1300, a video signal output terminal 1312 and an input/output terminal 1314 for data communication are provided at the side of a case 1302. As shown in FIG. 14, if required, a television monitor 1430 is connected to video signal output terminal 1312, and a personal computer 1440 is connected to the input/output terminal 1314 for data communication. Furthermore, a predetermined operation allows the image pick-up signal stored in the memory of the circuit board 1308 to be outputted to the television monitor 1430 or the personal computer 1440.

Besides the personal computer of FIG. 12, the portable telephone of FIG. 13, and the digital still camera of FIG. 14 an electronic apparatus includes a liquid crystal television, a view-finder-type or a monitor-direct-view-type video tape recorder, a car navigation system, a pager, an electronic organizer, an electronic calculator, a word processor, a workstation, a television telephone, a POS terminal, and a touch panel. Of course, the above-described display device can be used as a display device of the various electronic apparatuses.

What is claimed is:

1. A display device obtained by bonding a pixel element substrate having a plurality of pixel elements arranged thereon to a driving circuit board having a driving circuit for the plurality of pixel elements,
   wherein the driving circuit board includes connecting terminals connected to the driving circuit for the plurality of pixel elements on the surface of the driving circuit board facing the pixel element substrate,
   wherein the pixel element substrate comprises:
   a plurality of pixel electrodes formed on a transmissive substrate, the plurality of pixel elements being formed on the plurality of pixel electrodes such that respective ends of the pixel elements are adjacent to each other;
   common electrode wiring lines for commonly connecting the other respective ends of the plurality of pixel elements to each other;
   bank regions for separating the pixel elements from each other to define individual pixel element regions; and
   a plurality of individual electrode wiring lines for connecting the plurality of connecting terminals of the driving circuit board to the corresponding pixel electrodes of the plurality of pixel elements via through-holes formed in the bank regions.

2. A display device according to claim 1, wherein each of the bank regions has a plurality of stepped portions, the through-holes are formed at the highest portions of the stepped portions, and films of the pixel elements are formed using other stepped portions.

3. A display device according to claim 1, wherein each of the pixel elements comprises an organic electroluminescent element, a liquid crystal display device, or a light emitting diode.

4. A display device according to claim 1, wherein each of the pixel electrodes is a transparent electrode, and
   wherein the light emitted from or transmitted through the pixel elements is directed to the pixel element substrate.

5. An electronic apparatus including the display device according to claim 1.

6. A pixel element substrate comprising:
   a plurality of pixel electrodes formed on a transmissive substrate;
   a plurality of pixel elements formed on the plurality of pixel electrodes such that respective ends of the pixel elements are adjacent to each other;
   common electrode wiring lines for commonly connecting the other respective ends of the plurality of pixel elements to each other;
   bank regions for separating the pixel elements from each other to define individual pixel element regions; and
   a plurality of individual electrode wiring lines for connecting a plurality of external connections formed to correspond to the plurality of pixel electrodes on surfaces of the bank regions to the plurality of pixel electrodes via through-holes formed in the bank regions.

7. A method for manufacturing a pixel element substrate comprising:
   a first step of forming a conductive layer capable of transmitting light on a transmissive insulating substrate and patterning the conductive layer to form a plurality of pixel electrodes;
   a second step of forming an insulating layer on the plurality of pixel electrodes, and patterning the insulating layer to form a contact hole region and a pixel element forming region on each pixel electrode;
   a third step of forming each contact hole region and each pixel element forming region on the insulating layer, forming a bank layer having a first height of a relatively higher value at the periphery of each contact hole region and having a second height of a relatively lower value at the periphery of each pixel element forming region;
   a fourth step of forming a pixel element on a pixel electrode of each pixel element forming region; and
   a fifth step of forming a conductive layer on the contact hole, the bank layer, and each pixel element, and polishing the conductive layer until a portion of the bank layer having the first height is exposed.

8. A method for manufacturing a pixel element substrate according to claim 7, wherein the third step further comprises the steps of:
   forming, on the insulating layer, a first bank layer having the second height, which forms each contact hole region and each pixel element forming region, and
   forming a second bank layer having the first height at the periphery of each contact hole region in the first bank layer.

9. A method for manufacturing a pixel element substrate according to claim 7, wherein the pixel element is an organic electroluminescent element.

* * * * *